United States Patent
Zhu et al.

(10) Patent No.: US 10,139,948 B2
(45) Date of Patent: Nov. 27, 2018

(54) TOUCH DETECTION CIRCUIT, ITS DRIVING METHOD AND DISPLAY DEVICE

(71) Applicants: BOE TECHNOLOGY GROUP CO., LTD., Beijing (CN); BOE (HEBEI) MOBILE DISPLAY TECHNOLOGY CO., LTD., Hebei (CN)

(72) Inventors: Mingyan Zhu, Beijing (CN); Xiangyuan Sheng, Beijing (CN); Weihou Li, Beijing (CN); Lingling Dong, Beijing (CN); Yu Chen, Beijing (CN)

(73) Assignees: BOE TECHNOLOGY GROUP CO., LTD., Beijing (CN); BOE (HEBEI) MOBILE DISPLAY TECHNOLOGY CO. LTD., Hebei (CN)

( * ) Notice: Subject to any disclaimer, the term of this patent is extended or adjusted under 35 U.S.C. 154(b) by 288 days.

(21) Appl. No.: 15/246,208

(22) Filed: Aug. 24, 2016

(65) Prior Publication Data
US 2017/0277335 A1  Sep. 28, 2017

(30) Foreign Application Priority Data
Mar. 25, 2016 (CN) .......................... 2016 1 0179724

(51) Int. Cl.
*G06F 3/041* (2006.01)
*G06F 3/044* (2006.01)

(52) U.S. Cl.
CPC ............ *G06F 3/0416* (2013.01); *G06F 3/044* (2013.01); *G06F 3/0412* (2013.01)

(58) Field of Classification Search
None
See application file for complete search history.

(56) References Cited

U.S. PATENT DOCUMENTS

2011/0310079 A1* 12/2011 Kim ...................... G06F 3/0412
                                                    345/211
2012/0043971 A1*  2/2012 Maharyta ........... G01R 27/2605
                                                    324/658
(Continued)

FOREIGN PATENT DOCUMENTS

CN   102346607 A    2/2012
CN   105306038 A    2/2016

OTHER PUBLICATIONS

First Chinese Office Action regarding Application No. 201610179724.6 dated Feb. 27, 2018. Translation provided by Dragon Intellectual Property Law Firm.

*Primary Examiner* — Aneeta Yodichkas
*Assistant Examiner* — Parul Gupta
(74) *Attorney, Agent, or Firm* — Harness, Dickey & Pierce, P.L.C.

(57) ABSTRACT

The present disclosure provides a touch detection circuit, its driving method and a display device. The touch detection circuit includes a touch sensing electrode, a switch control unit, a touch detection unit, a first control signal terminal, a second control signal terminal, a third control signal terminal, a fourth control signal terminal, and a signal output terminal. At a charging stage subsequent to an initialization stage, a touch capacitance is generated at a position corresponding to the touch sensing electrode in the case that the touch sensing electrode is being touched, and the touch sensing electrode is charged through the switch control unit under the control of the first control signal terminal. As a result, it is able to detect charges stored on the touch sensing electrode by the touch detection unit at a detection stage, thereby to determine whether or not the touch sensing electrode is being touched in accordance with a detection signal from the signal output terminal.

20 Claims, 3 Drawing Sheets

(56) References Cited

U.S. PATENT DOCUMENTS

2014/0145733 A1    5/2014  Buttolo et al.
2014/0327652 A1*  11/2014  Murase ................... G06F 3/044
                                                              345/174
2017/0139529 A1*   5/2017  Ting ...................... G06F 3/0416

* cited by examiner

TOUCH DETECTION CIRCUIT, ITS DRIVING METHOD AND DISPLAY DEVICE

CROSS-REFERENCE TO RELATED APPLICATION

The present application claims a priority of the Chinese patent application No. 201610179724.6 filed on Mar. 25, 2016, which is incorporated herein by reference in its entirety.

TECHNICAL FIELD

The present disclosure relates to the field of touch technology, in particular to a touch detection circuit, its driving method and a display device.

BACKGROUND

As compared with a conventional mechanical key, a capacitive key does not need any mechanical contact, and as compared with a conventional metallic touch key, it is able for the capacitive key to prevent the potential risk due to the direct contact of a human body with a metallic sheet and to eliminate the application limitations. The capacitive key is durable and convenient to use (e.g., it may be controlled by lightly touching it), and has a well appearance. In addition, in combination with signal processing operations, it is very easy to quantize and adjust key switches. Currently, the capacitive key has been widely applied to such electrical appliances as mobile phones, televisions, washing machines and refrigerators.

However, in the related art, a specific induction capacitance detection chip and an associated external circuit need to be used, so as to achieve the capacitive touch operation. Usually, the induction capacitance detection chip includes a plurality of integrated multi-point detection chips. This specific integrated induction capacitance detection chip must also be used even in the case that an induction capacitance for a single contact point is to be detected, resulting in a waste of resources and a high detection cost.

SUMMARY

An object of the present disclosure is to provide a touch detection circuit, its driving method and a display device, so as to prevent the waste of resources and the high detection cost in the case of detecting an induction capacitance for a single contact point.

In one aspect, the present disclosure provides in some embodiments a touch detection circuit, including a touch sensing electrode, a switch control unit, a touch detection unit, a first control signal terminal, a second control signal terminal, a third control signal terminal, a fourth control signal terminal, and a signal output terminal. The touch sensing electrode is connected to a first terminal of the switch control unit, a second terminal of the switch control unit is connected to the first control signal terminal, a third terminal of the switch control unit is connected to the second control signal terminal, a fourth terminal of the switch control unit is connected to the third control signal terminal, a fifth terminal of the switch control unit is connected to a first terminal of the touch detection unit, a second terminal of the touch detection unit is connected to the fourth control signal terminal, and a third terminal of the touch detection unit is connected to the signal output terminal. At an initialization stage, the switch control unit is configured to, under the control of the first control signal terminal and the third control signal terminal, initialize the touch sensing electrode and the first terminal of the touch detection unit through the second control signal terminal. At a charging stage, the switch control unit is configured to, under the control of the first control signal terminal, charge the touch sensing electrode through the second control signal terminal in the case that the touch sensing electrode is being touched. At a detection stage, the switch control unit is configured to, under the control of the third control signal terminal, electrically connect the touch sensing electrode to the first terminal of the touch sensing unit, and the touch sensing unit is configured to, under the control of the fourth control signal terminal, apply a detection signal to the signal output terminal in the case that the touch sensing electrode is being touched.

Alternatively, the switch control unit includes a first switch unit and a second switch unit. A first terminal of the first switch unit is connected to the touch sensing electrode and a first terminal of the second switch unit, a second terminal of the first switch unit is connected to the first control signal terminal, and a third terminal of the first switch unit is connected to the second control signal terminal. The first switch unit is configured to, under the control of the first control signal terminal, electrically connect the touch sensing electrode to the second control signal terminal. A second terminal of the second switch unit is connected to the third control signal terminal, and a third terminal of the second switch unit is connected to the first terminal of the touch detection unit. The second switch unit is configured to, under the control of the third control signal terminal, electrically connect the touch sensing electrode and the first terminal of the first switch unit to the second terminal of the second switch unit.

Alternatively, the first switch unit includes a first three-state gate, an enabling terminal of which is connected to the first control signal terminal, an input terminal of which is connected to the second control signal terminal, and an output terminal of which is connected to the touch sensing electrode.

Alternatively, the first switch unit includes a first switch transistor, a gate electrode of which is connected to the first control signal terminal, a source electrode of which is connected to the second control signal terminal, and a drain electrode of which is connected to the touch sensing electrode.

Alternatively, the second switch unit includes a second three-state gate, an enabling terminal of which is connected to the third control signal terminal, an input terminal of which is connected to the touch sensing electrode, and an output terminal of which is connected to the first terminal of the touch detection unit.

Alternatively, the second switch unit includes a second switch transistor, a gate electrode of which is connected to the third control signal terminal, a source electrode of which is connected to the touch sensing electrode, and a drain electrode of which is connected to the first terminal of the touch detection unit.

Alternatively, the touch detection unit includes a driving transistor, a gate electrode of which is connected to the fifth terminal of the switch control unit, a source electrode of which is connected to the fourth control signal terminal, and a drain electrode of which is connected to the signal output terminal.

Alternatively, an insulation layer covers the touch sensing electrode.

Alternatively, the driving transistor is a P-channel Metal Oxide Semiconductor (PMOS) transistor or an N-channel Metal Oxide Semiconductor (NMOS) transistor.

In another aspect, the present disclosure provides in some embodiments a method for driving the above-mentioned touch detection circuit, including steps of: at an initialization stage, applying an active control signal to a first control signal terminal and a third control signal terminal, and applying a low level signal to a second control signal terminal; at a charging stage, applying the active control signal to the first control signal terminal continuously, and applying a high level signal to the second control signal terminal, so as to charge the touch sensing electrode in the case that the touch sensing electrode is being touched; and at a detection stage, applying an active control signal to the third control signal terminal, applying a high level signal to a fourth control signal terminal, and detecting a detection signal from a signal output terminal, so as to determine whether or not the touch sensing electrode is being touched.

In yet another aspect, the present disclosure provides in some embodiments a display device including the above-mentioned touch detection circuit.

According to the touch detection circuit, its driving method and the display device in the embodiments of the present disclosure, the touch detection circuit includes the touch sensing electrode, the switch control unit, the touch detection unit, the first control signal terminal, the second control signal terminal, the third control signal terminal, the fourth control signal terminal, and the signal output terminal. At the initialization stage, the switch control unit is configured to, under the control of the first control signal terminal and the third control signal terminal, initialize the touch sensing electrode and the first terminal of the touch detection unit through the second control signal terminal. At the charging stage, the switch control unit is configured to, under the control of the first control signal terminal, charge the touch sensing electrode through the second control signal terminal in the case that the touch sensing electrode is being touched. At the detection stage, the switch control unit is configured to, under the control of the third control signal terminal, electrically connect the touch sensing electrode to the first terminal of the touch sensing unit, and the touch sensing unit is configured to, under the control of the fourth control signal terminal, apply a detection signal to the signal output terminal in the case that the touch sensing electrode is being touched. As a result, it is able to determine whether or not the touch sensing electrode is being touched. In addition, the touch detection circuit is of a simple structure, and may be implemented easily.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

Figure 1:
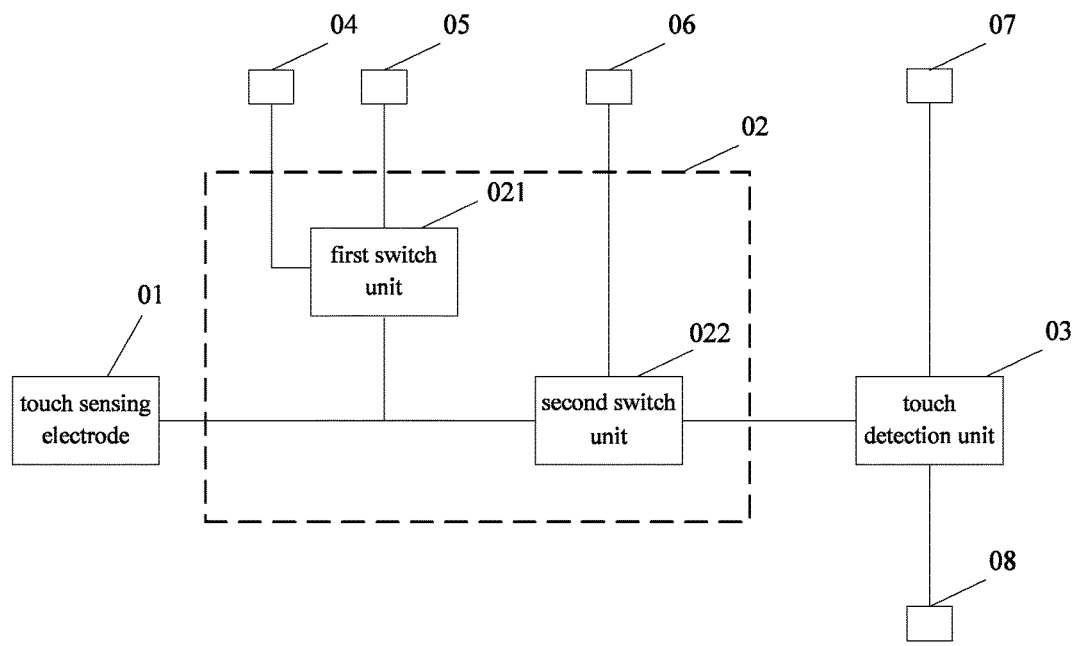
FIG. 1 is a schematic view showing a touch detection circuit according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Hereafter, it will be described a touch detection circuit, its driving method and a display device in details in embodiments of the present disclosure by referring to the drawings.

The present disclosure provides in some embodiments a touch detection circuit which, as shown in FIG. 1, may include a touch sensing electrode 01, a switch control unit 02, a touch detection unit 03, a first control signal terminal 04, a second control signal terminal 05, a third control signal terminal 06, a fourth control signal terminal 07, and a signal output terminal 08.

The touch sensing electrode 01 is connected to a first terminal of the switch control unit 02, a second terminal of the switch control unit 02 is connected to the first control signal terminal 04, a third terminal of the switch control unit 02 is connected to the second control signal terminal 05, a fourth terminal of the switch control unit 02 is connected to the third control signal terminal 06, a fifth terminal of the switch control unit 02 is connected to a first terminal of the touch detection unit 03, a second terminal of the touch detection unit 03 is connected to the fourth control signal terminal 07, and a third terminal of the touch detection unit 03 is connected to the signal output terminal 08.

At an initialization stage, the switch control unit 02 is configured to, under the control of the first control signal terminal 04 and the third control signal terminal 06, initialize the touch sensing electrode 01 and the first terminal of the touch detection unit 03 through the second control signal terminal 05.

At a charging stage, the switch control unit 02 is configured to, under the control of the first control signal terminal 04, charge the touch sensing electrode 01 through the second control signal terminal 05 in the case that the touch sensing electrode 01 is being touched.

At a detection stage, the switch control unit 02 is configured to, under the control of the third control signal terminal 06, electrically connect the touch sensing electrode 01 to the first terminal of the touch sensing unit 03, and the touch sensing unit 03 is configured to, under the control of the fourth control signal terminal 07, apply a detection signal to the signal output terminal 08 in the case that the touch sensing electrode 01 is being touched.

According to the touch detection circuit in the embodiments of the present disclosure, at the charging stage subsequent to the initialization stage, in the case that the touch sensing electrode 01 is being touched, a touch capacitance may be generated at a position corresponding to the touch sensing electrode 01. At this time, the touch sensing electrode 01 may be charged through the switch control unit 02 under the control of the first control signal terminal 04. Thus, at the detection stage, charges stored in the touch sensing electrode 01 may be detected by the touch detection unit 03, and whether or not the touch sensing electrode 01 is being touched may be detected in accordance with the detection signal from the signal output terminal. As a result, it is able to determine whether or not the touch sensing electrode is being touched. In addition, the touch detection circuit is of a simple structure, and may be implemented easily.

To be specific, as shown in FIG. 1, the switch control unit 02 may include a first switch unit 021 and a second switch unit 022. A first terminal of the first switch unit 021 is connected to the touch sensing electrode 01 and a first terminal of the second switch unit 022, a second terminal of the first switch unit 021 is connected to the first control signal terminal 04, and a third terminal of the first switch unit 021 is connected to the second control signal terminal 05. The first switch unit 021 is configured to, under the control of the first control signal terminal 04, electrically connect the touch sensing electrode 01 to the second control signal terminal 05.

A second terminal of the second switch unit 022 is connected to the third control signal terminal 06, and a third terminal of the second switch unit 022 is connected to the first terminal of the touch detection unit 03. The second switch unit 022 is configured to, under the control of the third control signal terminal 06, electrically connect the touch sensing electrode 01 and the first terminal of the first switch unit 021 to the second terminal of the second switch unit 022.

An operation procedure of the touch detection circuit will be described hereinafter.

At the initialization stage, the touch sensing electrode 01 is electrically connected to the second control signal terminal 05 through the first switch unit 021 under the control of the first control signal terminal 04, and charges on the touch sensing electrode 01 are released via the second control signal terminal. In addition, the touch sensing electrode 01 and the first terminal of the first switch unit 021 are electrically connected to the second terminal of the second switch unit 022 through the second switch unit 022 under the control of the third control signal terminal 06. In this way, the touch detection unit 03 is electrically connected to the second control signal terminal 05, so as to release charges on the touch detection unit 03 through the second control signal terminal 05.

At the charging stage, the touch sensing electrode 01 is electrically connected to the second control signal terminal 05 through the first switch unit 021 under the control of the first control signal terminal 04, and the touch detection unit 03 is disconnected from the touch sensing electrode 01 and the first terminal of the first switch unit 021 through the second switch unit 022 under the control of the third control signal terminal 06. At this time, in the case that the touch sensing electrode 01 is being touched to generate a touch capacitance, it may be charged through the second control signal terminal 05, and in the case that the touch sensing electrode 01 is not being touched, it may not be charged.

At the detection stage, the touch sensing electrode 01 is disconnected from the second control signal terminal 05 through the first switch unit 021 under the control of the first control signal terminal 04, and the touch sensing electrode 01 and the first terminal of the first switch unit 021 are electrically connected to the second terminal of the second switch unit 022 through the second switch unit 022 under control of the third control signal terminal 06, so as to electrically connect the touch sensing electrode 01 to the touch detection unit 03. In this way, it is able to determine whether or not the touch sensing electrode 01 is being touched by detecting, through the touch detection unit 03, whether or not there are charges on the touch sensing electrode 01, thereby to output the detection signal via the output terminal.

Figure 2:
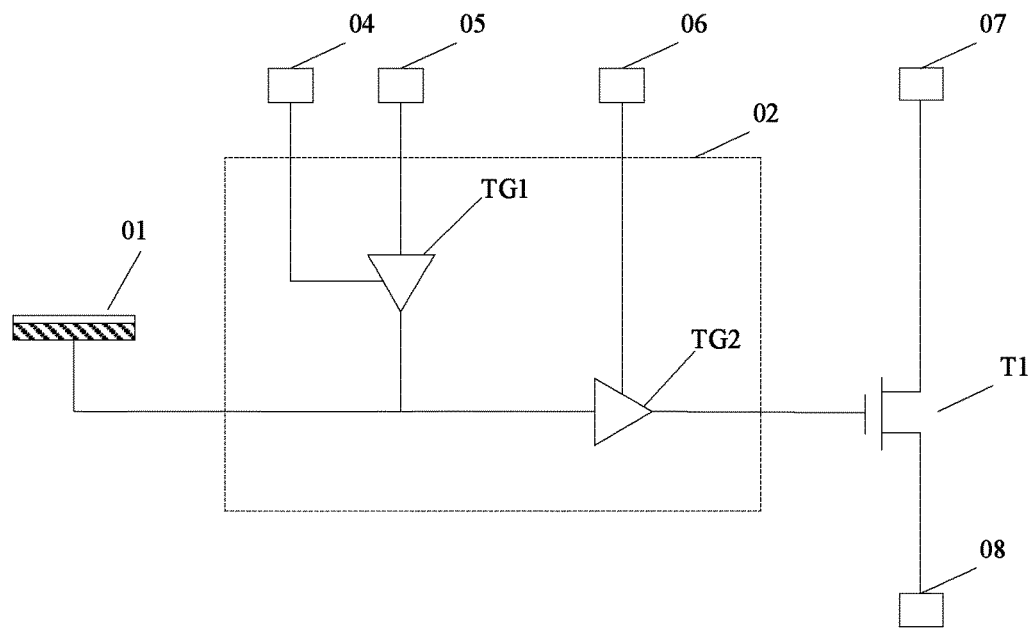
FIG. 2 is another schematic view showing the touch detection circuit according to one embodiment of the present disclosure.

Further, as shown in FIG. 2, the first switch unit 021 may include a first three-state gate TG1, an enabling terminal of which is connected to the first control signal terminal 04, an input terminal of which is connected to the second control signal terminal 05, and an output terminal of which is connected to the touch sensing electrode 01.

Further, the second switch unit 022 may include a second three-state gate TG2, an enabling terminal of which is connected to the third control signal terminal 06, an input terminal of which is connected to the touch sensing electrode 01, and an output terminal of which is connected to the first terminal of the touch detection unit 03.

In the case that the first switch unit 021 includes the first three-state gate TG1 and the second switch unit 022 includes the second three-state gate TG2, the operation procedure of the touch detection circuit will be described hereinafter.

At the initialization stage, the first three-state gate TG1 is in an on state under the control of the first control signal terminal 04, and the second three-state gate TG2 is in the on state under the control of the third control signal terminal 06. At this time, the touch sensing electrode 01 and the touch detection unit 03 are electrically connected to the second control signal terminal 05, so as to release the charges on the touch sensing electrode 01 and the touch detection unit 3 through the second control signal terminal 05.

At the charging stage, the first three-state gate TG1 is in the on state under the control of the first control signal terminal 04, and the second three-state gate TG2 is in the on state under the control of the third control signal terminal 06. At this time, the touch sensing electrode 01 is electrically connected to the second control signal terminal 05, and the touch detection unit 03 is disconnected from the touch sensing electrode 01 and the output terminal of the first three-state gate TG1. In the case that the touch sensing electrode 01 is being touched to generate a touch capacitance, the touch sensing electrode 01 may be charged through the second control signal terminal 05, and in the case that the touch sensing electrode 01 is not being touched, the touch sensing electrode 01 may not be charged.

At the detection stage, the first three-state gate TG1 is in an off state under the control of the first control signal terminal 04, and the second three-state gate TG2 is in the on state under the control of the third control signal terminal 06.

At this time, the touch sensing electrode 01 is electrically connected to the touch detection unit 03. As a result, it is able to determining whether or not the touch sensing electrode 01 is being touched by detecting, through the touch detection unit 3, whether or not there are charges on the touch sensing electrode 01, thereby to output the detection signal via the output terminal.

Alternatively, the first switch unit 021 may include a first switch transistor, a gate electrode of which is connected to the first control signal terminal 04, a source electrode of which is connected to the second control signal terminal 05, and a drain electrode of which is connected to the touch sensing electrode 01.

Alternatively, the second switch unit 022 may include a second switch transistor, a gate electrode of which is connected to the third control signal terminal 06, a source electrode of which is connected to the touch sensing electrode 01, and a drain electrode of which is connected to the first terminal of the touch detection unit 03.

In the case that the first switch unit 021 includes the first switch transistor and the second switch unit 022 includes the second switch transistor, the operation procedure of the touch detection circuit may be similar to that of the touch detection circuit where the first switch unit 021 includes the first three-state gate and the second switch unit 022 includes the second three-state gate. During the implementation, the first three-state gate and the second switch transistor, or the first switch transistor and the second three-state gate, may be combined together to form the switch control unit 02, as long as a switch function may be achieved. In addition, the first switch transistor and the second switch transistor may each be an N-type or a P-type transistor.

As shown in FIG. 2, the touch detection unit 03 may include a driving transistor T1, a gate electrode of which is connected to the fifth terminal of the switch control unit 02, a source electrode of which is connected to the fourth control signal terminal 07, and a drain electrode of which is connected to the signal output terminal 08.

At the initialization stage and the charging stage, the driving transistor T1 may be in a high impedance state under the control of the fourth control signal terminal 07. At the detection stage, in response to the detection of the charges on the touch sensing electrode 01, the driving transistor T1 may output a high level, and in response to the absence of the charges, the driving transistor T1 may in the high impedance state. As a result, it is able to determine whether or not the touch sensing electrode 01 is being touched in accordance with the detection signal from the output terminal.

Alternatively, the driving transistor T1 may be a PMOS transistor or an NMOS transistor.

Alternatively, as shown in FIG. 2, an insulation layer may cover the touch sensing electrode 01. In this way, it is able to prevent the touch sensing electrode 01 from being damaged in the case that the touch sensing electrode 01 is in direct contact with an external grounding conductor (e.g., hand or stylus).

Figure 3:
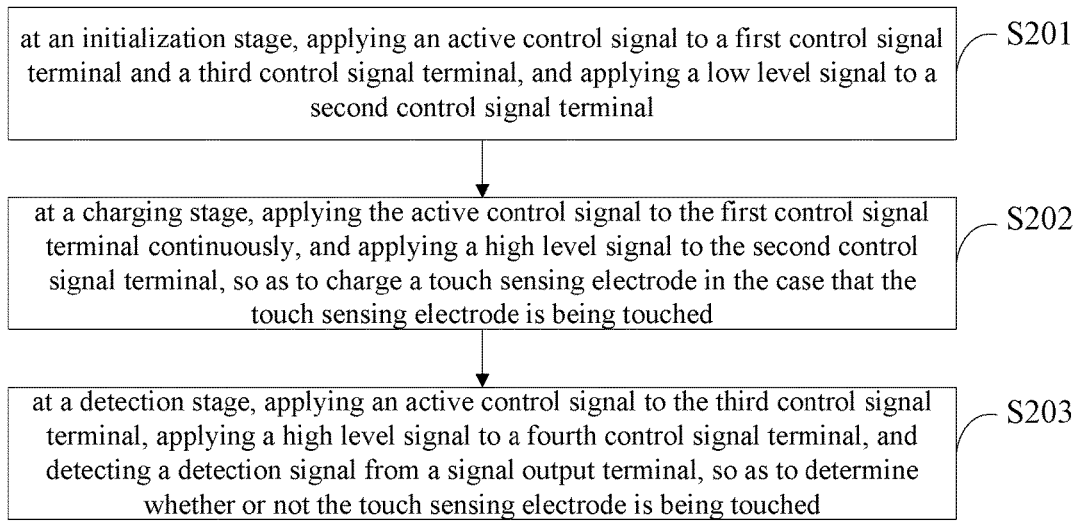
FIG. 3 is flow chart of a method for driving the touch detection circuit according to one embodiment of the present disclosure.

Based on an identical inventive concept, the present disclosure further provides in some embodiments a method for driving the above-mentioned touch detection circuit. As shown in FIG. 3, the driving method includes: Step S201 of, at the initialization stage, applying an active control signal to the first control signal terminal and the third control signal terminal, and applying a low level signal to the second control signal terminal; Step S202 of, at the charging stage, applying the active control signal to the first control signal terminal continuously, and applying a high level signal to the second control signal terminal, so as to charge the touch sensing electrode in the case that the touch sensing electrode is being touched; and Step S203 of, at the detection stage, applying an active control signal to the third control signal terminal, applying a high level signal to the fourth control signal terminal, and detecting a detection signal from the signal output terminal, so as to determine whether or not the touch sensing electrode is being touched.

Figure 4:
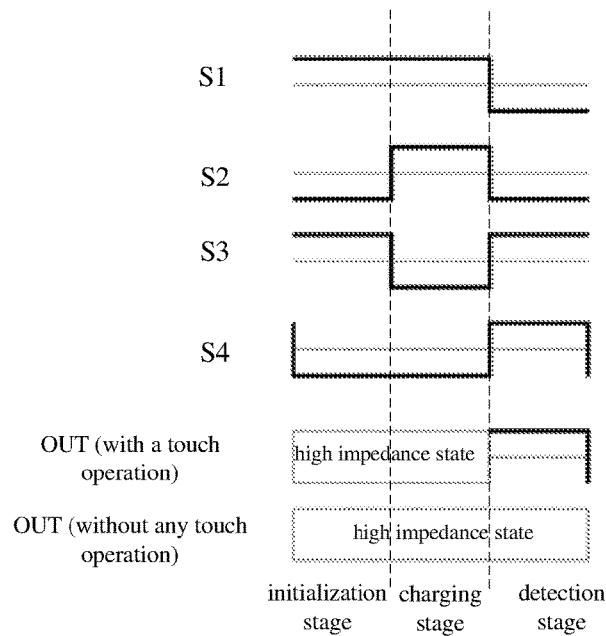
FIG. 4 is a sequence diagram of the touch detection circuit according to one embodiment of the present disclosure.

The driving method will be described hereinafter in more details in conjunction with the touch detection circuit in FIG. 2 and the sequence in FIG. 4. In FIG. 4, S1, S2, S3 and S4 represent control signals applied to the first control signal terminal, the second control signal terminal, the third control signal terminal and the fourth control signal terminal respectively, and OUT represents the detection signal from the signal output terminal.

In the case that the first switch unit 021 is the first three-state gate TG1, the second switch unit 022 is the second three-state gate TG2, the touch detection unit 03 is the driving transistor T1, and the driving transistor T1 is an NMOS transistor, Step S201 may be implemented as follows. At the initialization stage, a high level signal may be applied to the first control signal terminal 04 and the third control signal terminal 06, and a low level signal may be applied to the second control signal terminal 05, so as to turn on the first three-state gate TG1 and the second three-state gate TG2, and electrically connect the touch sensing electrode 01 and the gate electrode of the driving transistor T1 to the second control signal terminal 05, thereby to release the charges on the touch sensing electrode 01 and the gate electrode of the driving transistor T1 through the second control signal terminal 05. At this time, the driving transistor T1 is electrically connected to the second control signal terminal 05. Because of the low level signal applied to the second control signal terminal 05, the driving transistor T1 is turned off, so that the outputted detection signal in the high impedance state.

Step S202 may be implemented as follows. At the charging stage, the high level signal may be continuously applied to the first control signal terminal 04 and the second control signal terminal 05, and a low level signal may be applied to the third control signal terminal 06, so as to turn on the first three-state gate TG1 and turn off the three-state gate TG2. In the case that the touch sensing electrode 01 is being touched to generate a touch capacitance, the touch sensing electrode 01 may be charged through the second control signal terminal 05, and in the case that the touch sensing electrode 01 is not being touched, the touch sensing electrode 01 may not be charged. At this time, the driving transistor T1 is not electrically connected to the second control signal terminal 05, so the gate electrode of the driving transistor T1 is in the high impedance state, and the outputted detection signal is in the high impedance state too.

Step S203 may be implemented as follows. At the detection stage, a low level signal may be applied to the first control signal terminal 04, a low level signal may be applied to the second control signal terminal 05, a high level signal may be applied to the third control signal terminal 06, and a high level signal may be applied to the fourth control signal terminal 07, so as to turn off the first three-state gate TG1 and turn on the second three-state gate TG2. At this time, the touch sensing electrode 01 is electrically connected to the gate electrode of the driving transistor T1. In the case that charges are stored on the touch sensing electrode 01, the gate electrode of the driving transistor T1 may be turned on. Because of the high level signal applied to the fourth control signal terminal 07, the driving transistor T1 may output a high level signal. In the case that there are no charges on the touch sensing electrode 01, the gate electrode of the driving transistor T1 may be turned off, and the outputted detection signal may be in the high impedance state.

Figure 5:
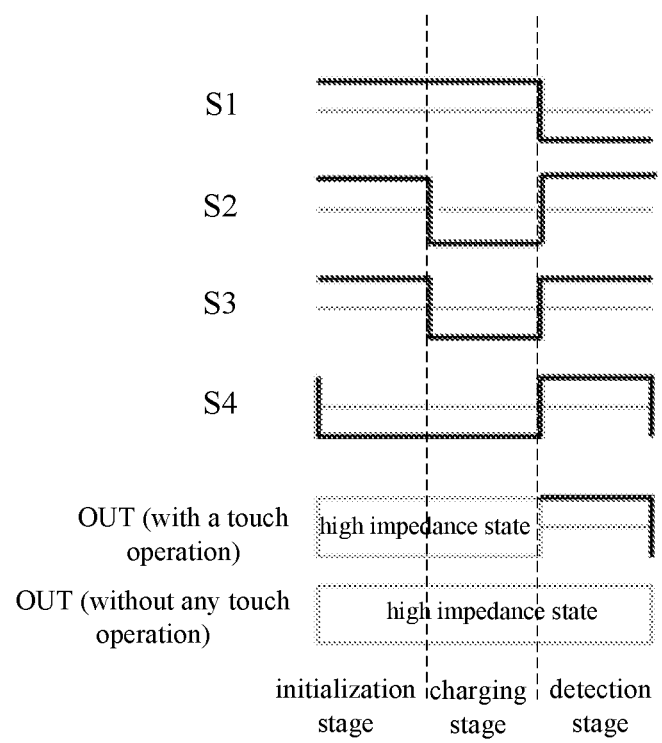
FIG. 5 is another sequence diagram of the touch detection circuit according to one embodiment of the present disclosure.

FIG. 5 is a sequence diagram of the touch detection circuit where the driving transistor is a PMOS transistor, and an operation procedure thereof is similar to that of the touch detection circuit where the driving transistor is an NMOS transistor, merely with the differences that a high level signal is applied to the second control signal terminal at the initialization stage, a low level signal is applied to the second control signal terminal at the charging stage, and a high level signal is applied to the second control signal terminal at the detection stage.

In a word, the outputted detection signal will be at a high level only when the touch sensing electrode is touched, and in any other cases, the outputted detection signal will be in the high impedance state. As a result, it is able to determine whether or not the touch sensing electrode is being touched in accordance with the detection signal from the signal output terminal.

Based on an identical inventive concept, the present disclosure provides in some embodiments a display device including the above-mentioned touch detection circuit. The display device may be any product or member having a display function, such as a mobile phone, a flat-panel computer, a television, a display, a laptop computer, a digital photo frame or a navigator. The implementation of the display device may refer to that of the touch detection circuit.

According to the touch detection circuit, its driving method and the display device in the embodiments of the present disclosure, at the charging stage subsequent to the initialization stage, in the case that the touch sensing electrode is being touched, a touch capacitance may be generated at a position corresponding to the touch sensing electrode. At this time, the touch sensing electrode may be charged through the switch control unit under the control of the first control signal terminal. In this way, the charges stored on the touch sensing electrode may be detected by the touch detection unit at the detection stage, so it is able to determine whether or not the touch sensing electrode is being touched in accordance with the detection signal from the signal output terminal. In addition, the touch detection circuit is of a simple structure, and may be implemented easily.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A touch detection circuit, comprising a touch sensing electrode, a switch control unit, a touch detection unit, a first control signal terminal, a second control signal terminal, a third control signal terminal, a fourth control signal terminal, and a signal output terminal, wherein
    the touch sensing electrode is connected to a first terminal of the switch control unit, a second terminal of the switch control unit is connected to the first control signal terminal, a third terminal of the switch control unit is connected to the second control signal terminal, a fourth terminal of the switch control unit is connected to the third control signal terminal, a fifth terminal of the switch control unit is connected to a first terminal of the touch detection unit, a second terminal of the touch detection unit is connected to the fourth control signal terminal, and a third terminal of the touch detection unit is connected to the signal output terminal;
    at an initialization stage, the switch control unit is configured to, under the control of the first control signal terminal and the third control signal terminal, initialize the touch sensing electrode and the first terminal of the touch detection unit through the second control signal terminal;
    at a charging stage, the switch control unit is configured to, under the control of the first control signal terminal, charge the touch sensing electrode through the second control signal terminal in the case that the touch sensing electrode is being touched; and
    at a detection stage, the switch control unit is configured to, under the control of the third control signal terminal, electrically connect the touch sensing electrode to the first terminal of the touch sensing unit, and the touch sensing unit is configured to, under the control of the fourth control signal terminal, apply a detection signal to the signal output terminal in the case that the touch sensing electrode is being touched.

2. The touch detection circuit according to claim 1, wherein the switch control unit comprises a first switch unit and a second switch unit;
    a first terminal of the first switch unit is connected to the touch sensing electrode and a first terminal of the second switch unit, a second terminal of the first switch unit is connected to the first control signal terminal, and a third terminal of the first switch unit is connected to the second control signal terminal, and the first switch unit is configured to, under the control of the first control signal terminal, electrically connect the touch sensing electrode to the second control signal terminal; and
    a second terminal of the second switch unit is connected to the third control signal terminal, and a third terminal of the second switch unit is connected to the first terminal of the touch detection unit, and the second switch unit is configured to, under the control of the third control signal terminal, electrically connect the touch sensing electrode and the first terminal of the first switch unit to the second terminal of the second switch unit.

3. The touch detection circuit according to claim 2, wherein the first switch unit comprises a first three-state gate, an enabling terminal of the first three-state gate is connected to the first control signal terminal, an input terminal of the first three-state gate is connected to the second control signal terminal, and an output terminal of the first three-state gate is connected to the touch sensing electrode.

4. The touch detection circuit according to claim 2, wherein the first switch unit comprises a first switch transistor, a gate electrode of the first switch transistor is connected to the first control signal terminal, a source electrode of the first switch transistor is connected to the second control signal terminal, and a drain electrode of the first switch transistor is connected to the touch sensing electrode.

5. The touch detection circuit according to claim 2, wherein the second switch unit comprises a second three-state gate, an enabling terminal of the second three-state gate is connected to the third control signal terminal, an input terminal of the second three-state gate is connected to the touch sensing electrode, and an output terminal of the second three-state gate is connected to the first terminal of the touch detection unit.

6. The touch detection circuit according to claim 2, wherein the second switch unit comprises a second switch transistor, a gate electrode of the second switch transistor is connected to the third control signal terminal, a source electrode of the second switch transistor is connected to the touch sensing electrode, and a drain electrode of the second switch transistor is connected to the first terminal of the touch detection unit.

7. The touch detection circuit according to claim 1, wherein the touch detection unit comprises a driving transistor, a gate electrode of the driving transistor is connected to the fifth terminal of the switch control unit, a source electrode of the driving transistor is connected to the fourth control signal terminal, and a drain electrode of the driving transistor is connected to the signal output terminal.

8. The touch detection circuit according to claim 2, wherein the touch detection unit comprises a driving transistor, a gate electrode of the driving transistor is connected to the fifth terminal of the switch control unit, a source electrode of the driving transistor is connected to the fourth control signal terminal, and a drain electrode of the driving transistor is connected to the signal output terminal.

9. The touch detection circuit according to claim 1, wherein an insulation layer covers the touch sensing electrode.

10. The touch detection circuit according to claim 7, wherein the driving transistor is a P-channel Metal Oxide Semiconductor (PMOS) transistor or an N-channel Metal Oxide Semiconductor (NMOS) transistor.

11. A method for driving the touch detection circuit according to claim 1, comprising steps of:
at an initialization stage, applying an active control signal to a first control signal terminal and a third control signal terminal, and applying a low level signal to a second control signal terminal;
at a charging stage, applying the active control signal to the first control signal terminal continuously, and applying a high level signal to the second control signal terminal, so as to charge the touch sensing electrode in the case that the touch sensing electrode is being touched; and
at a detection stage, applying an active control signal to the third control signal terminal, applying a high level signal to a fourth control signal terminal, and detecting a detection signal from a signal output terminal, so as to determine whether or not the touch sensing electrode is being touched.

12. A display device comprising the touch detection circuit according to claim 1, the touch detection circuit comprising a touch sensing electrode, a switch control unit, a touch detection unit, a first control signal terminal, a second control signal terminal, a third control signal terminal, a fourth control signal terminal, and a signal output terminal, wherein
the touch sensing electrode is connected to a first terminal of the switch control unit, a second terminal of the switch control unit is connected to the first control signal terminal, a third terminal of the switch control unit is connected to the second control signal terminal, a fourth terminal of the switch control unit is connected to the third control signal terminal, a fifth terminal of the switch control unit is connected to a first terminal of the touch detection unit, a second terminal of the touch detection unit is connected to the fourth control signal terminal, and a third terminal of the touch detection unit is connected to the signal output terminal;
at an initialization stage, the switch control unit is configured to, under the control of the first control signal terminal and the third control signal terminal, initialize the touch sensing electrode and the first terminal of the touch detection unit through the second control signal terminal;
at a charging stage, the switch control unit is configured to, under the control of the first control signal terminal, charge the touch sensing electrode through the second control signal terminal in the case that the touch sensing electrode is being touched; and
at a detection stage, the switch control unit is configured to, under the control of the third control signal terminal, electrically connect the touch sensing electrode to the first terminal of the touch sensing unit, and the touch sensing unit is configured to, under the control of the fourth control signal terminal, apply a detection signal to the signal output terminal in the case that the touch sensing electrode is being touched.

13. The display device according to claim 12, wherein the switch control unit comprises a first switch unit and a second switch unit;
a first terminal of the first switch unit is connected to the touch sensing electrode and a first terminal of the second switch unit, a second terminal of the first switch unit is connected to the first control signal terminal, and a third terminal of the first switch unit is connected to the second control signal terminal, and the first switch unit is configured to, under the control of the first control signal terminal, electrically connect the touch sensing electrode to the second control signal terminal; and
a second terminal of the second switch unit is connected to the third control signal terminal, and a third terminal of the second switch unit is connected to the first terminal of the touch detection unit, and the second switch unit is configured to, under the control of the third control signal terminal, electrically connect the touch sensing electrode and the first terminal of the first switch unit to the second terminal of the second switch unit.

14. The display device according to claim 13, wherein the first switch unit comprises a first three-state gate, an enabling terminal of the first three-state gate is connected to the first control signal terminal, an input terminal of the first three-state gate is connected to the second control signal terminal, and an output terminal of the first three-state gate is connected to the touch sensing electrode.

15. The display device according to claim 13, wherein the first switch unit comprises a first switch transistor, a gate electrode of the first switch transistor is connected to the first control signal terminal, a source electrode of the first switch transistor is connected to the second control signal terminal, and a drain electrode of the first switch transistor is connected to the touch sensing electrode.

16. The display device according to claim 13, wherein the second switch unit comprises a second three-state gate, an enabling terminal of the second three-state gate is connected to the third control signal terminal, an input terminal of the second three-state gate is connected to the touch sensing electrode, and an output terminal of the second three-state gate is connected to the first terminal of the touch detection unit.

17. The display device according to claim 14, wherein the second switch unit comprises a second switch transistor, a gate electrode of the second switch transistor is connected to the third control signal terminal, a source electrode of the second switch transistor is connected to the touch sensing electrode, and a drain electrode of the second switch transistor is connected to the first terminal of the touch detection unit.

18. The display device according to claim 12, wherein the touch detection unit comprises a driving transistor, a gate electrode of the driving transistor is connected to the fifth terminal of the switch control unit, a source electrode of the driving transistor is connected to the fourth control signal terminal, and a drain electrode of the driving transistor is connected to the signal output terminal.

19. The display device according to claim 12, wherein an insulation layer covers the touch sensing electrode.

20. The display device according to claim 18, wherein the driving transistor is a P-channel Metal Oxide Semiconductor (PMOS) transistor or an N-channel Metal Oxide Semiconductor (NMOS) transistor.

\* \* \* \* \*